(12) United States Patent
Yang

(10) Patent No.: US 7,478,667 B2
(45) Date of Patent: Jan. 20, 2009

(54) HEAT SINK CLIP AND ASSEMBLY

(75) Inventor: Cheng-Peng Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 268 days.

(21) Appl. No.: 11/308,724

(22) Filed: Apr. 26, 2006

(65) Prior Publication Data
US 2007/0091573 A1 Apr. 26, 2007

(30) Foreign Application Priority Data
Oct. 21, 2005 (TW) .................................. 94137033

(51) Int. Cl.
*H05K 7/20* (2006.01)
(52) U.S. Cl. .................. 165/80.2; 165/80.3; 361/704
(58) Field of Classification Search .............. 165/80.3, 165/185, 80.2; 361/704
See application file for complete search history.

(56) References Cited

U.S. PATENT DOCUMENTS

| 5,448,449 | A | * | 9/1995 | Bright et al. ................ 361/704 |
| 5,617,292 | A | | 4/1997 | Steiner |
| 5,638,258 | A | * | 6/1997 | Lin ............................ 361/704 |
| 6,115,253 | A | * | 9/2000 | Clemens et al. ............ 361/704 |
| 6,318,452 | B1 | * | 11/2001 | Lee ........................... 165/80.3 |
| 6,332,251 | B1 | * | 12/2001 | Ho et al. ...................... 24/459 |
| 6,778,395 | B1 | * | 8/2004 | Dong et al. ................ 361/704 |
| 2003/0026073 | A1 | * | 2/2003 | McGowan et al. .......... 361/687 |
| 2003/0214787 | A1 | * | 11/2003 | Liu ............................ 361/704 |
| 2004/0179340 | A1 | * | 9/2004 | Lin ............................ 361/704 |
| 2005/0072555 | A1 | * | 4/2005 | Sheng-Hsiung ............ 165/80.3 |

FOREIGN PATENT DOCUMENTS

GB 2390227 A * 12/2003
JP 2001230575 A * 8/2001

* cited by examiner

*Primary Examiner*—Allen J Flanigan
(74) *Attorney, Agent, or Firm*—Frank R. Niranjan

(57) ABSTRACT

A heat sink clip and an assembly incorporating such clip are provided. The heat sink clip comprises: a body, an actuating member and a movable fastener. The body has a securing portion formed at one end thereof. The actuating member is pivotably mounted to the securing portion of said body and has a main body. The main body defines an open aperture therein. The movable fastener is pivotably connected to the open aperture of the actuating member. The actuating member is turnable relative to the body between an unlocked position and a locked position.

15 Claims, 5 Drawing Sheets

HEAT SINK CLIP AND ASSEMBLY

FIELD OF THE INVENTION

The present invention relates to a heat sink assembly, and particularly to a heat sink assembly incorporating a clip which can conveniently mount the heat sink assembly to a heat generating unit.

DESCRIPTION OF RELATED ART

With the continuing advance of computer technology, electronic components such as computer central processing units (CPUs) are being made to operate at higher operational speeds and with greater functional capabilities. When a CPU operates at a high speed in a computer enclosure, its temperature increases greatly. To avoid damage, the heat generated by the CPU must be dissipated quickly, for example, by using a heat sink attached to the surface of the CPU in the enclosure. This allows the CPU and other high-performance electronic components in the enclosure to function within their normal operating temperature ranges, thereby assuring the quality of CPU data management, storage and transfer. Usually, a clip is required for mounting the heat sink to the CPU.

One conventional heat sink clip is shown in U.S. Pat. No. 5,617,292. The heat sink clip comprises a body and a separate leg member. The body has a locking arm at one end thereof, and has a securing portion at the other end thereof. The separate leg member has an operation handle at an upper portion thereof, and a locking foot at a lower portion thereof. The separate leg member defines a slot between the operation handle and the locking foot for receiving the securing portion of the body therein.

However, it is difficult to operate the heat sink clip. To generate a downward pressing force against the heat sink via the heat sink clip, it is necessary to press the operation handle downwardly to thereby secure the locking foot of the separate leg member to a retention module. Pressing the operation handle into position requires a lot of force, and it is not easy for the operator to mount the locking foot onto the retention module.

Therefore, an improved heat sink clip for a heat generating unit which can overcome the above problems is desired.

SUMMARY OF INVENTION

A heat sink clip in accordance with the present invention comprises: a body, an actuating member and a movable fastener. The body has a securing portion formed at one end thereof. The actuating member is pivotably mounted to the securing portion of the body and has a main body. The main body defines an open aperture therein. The movable fastener is pivotably connected to the open aperture of the actuating member, and the actuating member is turnable relative to the body between an unlocked position and a locked position.

Other advantages and novel features of the present invention can be drawn from the following detailed description of a preferred embodiment of the present invention together with the attached drawings, in which:

DETAILED DESCRIPTION

Figure 1:
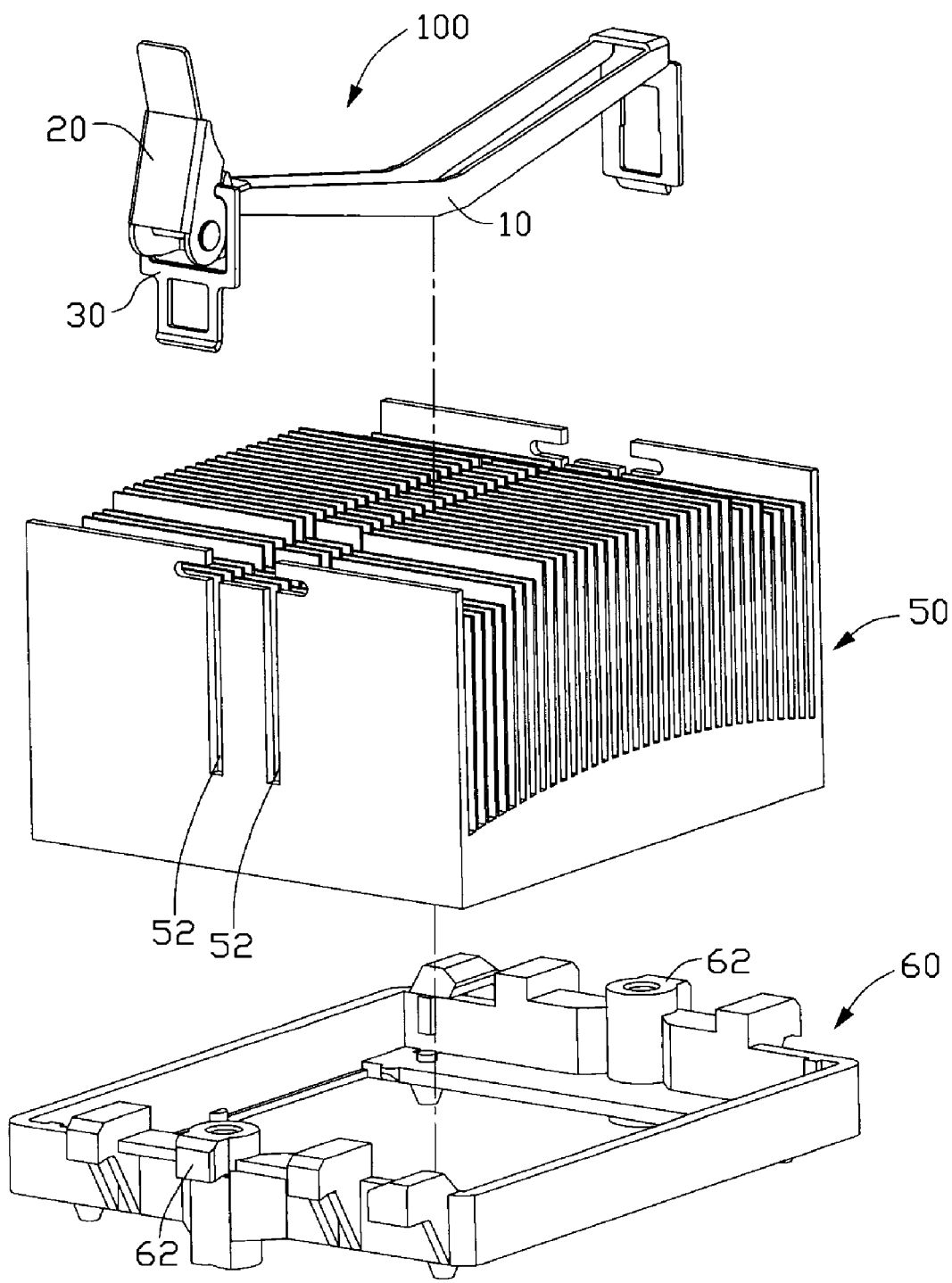
FIG. 1 is an exploded view of a heat sink assembly in accordance with a preferred embodiment of the present invention.

Referring to FIG. 1, a heat sink assembly in accordance with a preferred embodiment of the present invention comprises a heat sink clip 100, a heat sink 50 and a retention module 60. The heat sink clip 100 cooperates with the retention module 60 to secure the heat sink 50. The heat sink 50 defines two parallel locating grooves 52 for receiving the heat sink clip 100 therein. Each of two opposite sides of the retention module 60 forms a locking block 62 extending outwardly therefrom.

Figure 2:
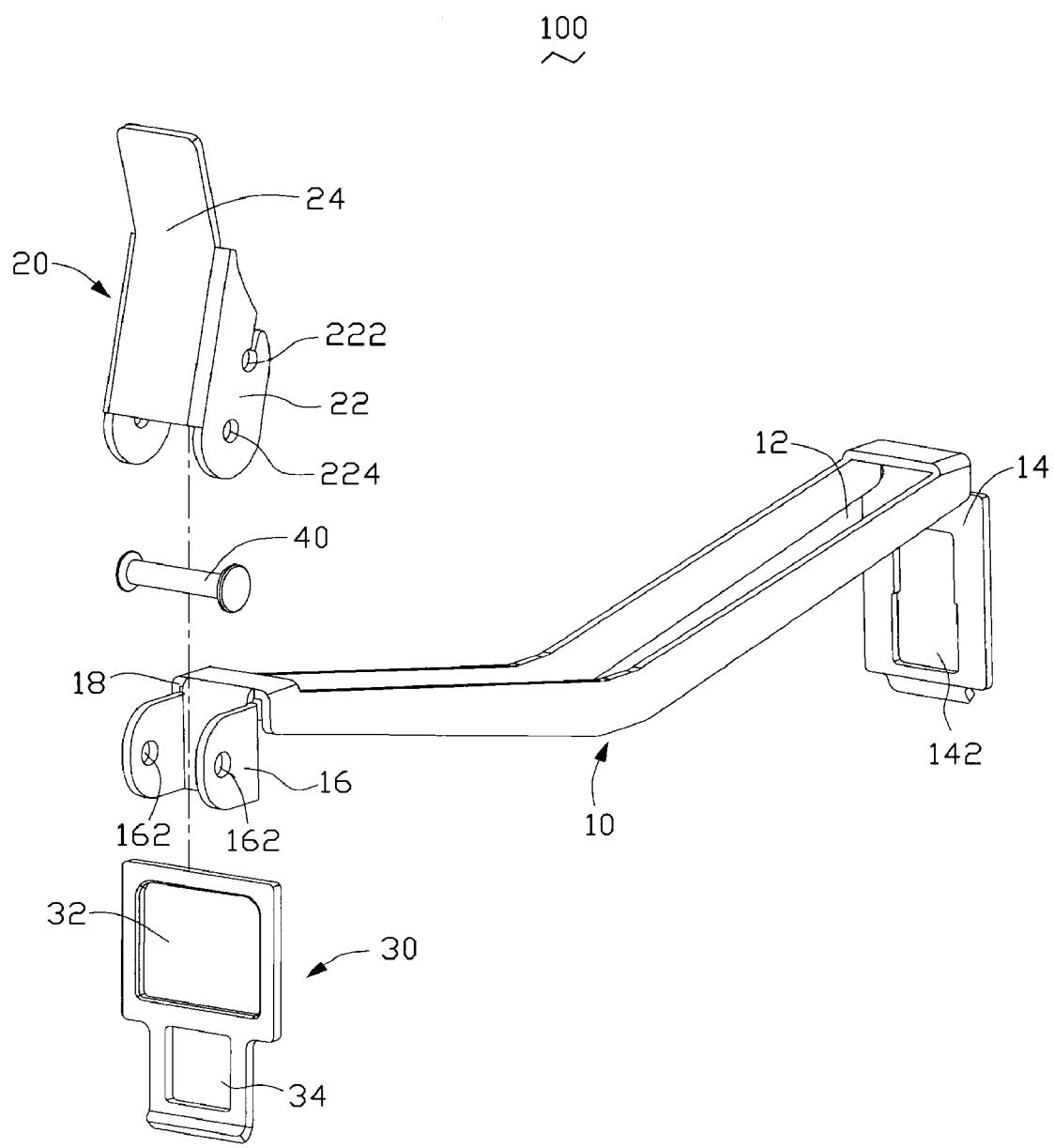
FIG. 2 is an exploded view of a heat sink clip of the heat sink assembly of FIG. 1.

Referring to FIG. 2, the heat sink clip 100 comprises a body 10, an actuating member 20, a movable fastener 30 and a pivot 40.

The body 10 defines an elongated slot 12 between one end and the other end thereof. The body 10 has a locking arm 14 integrally formed at one end thereof, the locking arm 14 defines a mounting hole 142 for engaging with the locking block 62 at one side of the retention module 60. The body 10 forms a securing portion 16 and a bearing portion 18 at the other end thereof. The securing portion 16 defines a pair of coaxial pivot holes 162 therein.

The actuating member 20 comprises a main body 22. An operating handle 24 extends upwardly from an upper portion of the main body 22. The upper portion of the main body 22 defines an open aperture 222 therein. Two pivot holes 224 are axially defined through a lower portion of the main body 22.

The movable fastener 30 is an elongated metal plate. An opening 32 is defined in an upper portion of the movable fastener 30. A mounting hole 34 is defined in a lower portion of the movable fastener 30 corresponding to the locking block 62 at the other side of the retention module 60.

Referring to FIG. 1 and FIG. 2, in assembly of the heat sink clip 100, the pivot 40 is extended through the pivot holes 224 of the actuating member 20 and the pivot holes 162 of the securing portion 16 of the body 10 to pivotably mount the actuating member 20 to the body 10. One portion of the movable fastener 30 above the opening 32 is then pivotably connected to the open aperture 222 of the actuating member 20 whereby the lower portion of the main body 22 of the actuating member 20 extends in the opening 32. The actuating member 20 is pivotable from an unlocked position to a locked position where it pulls the movable fastener 30 upwardly to fasten with the retention module 60 by having the locking block 62 securely engaging in the mounting hole 34 of the movable fastener 30.

Figure 3A:
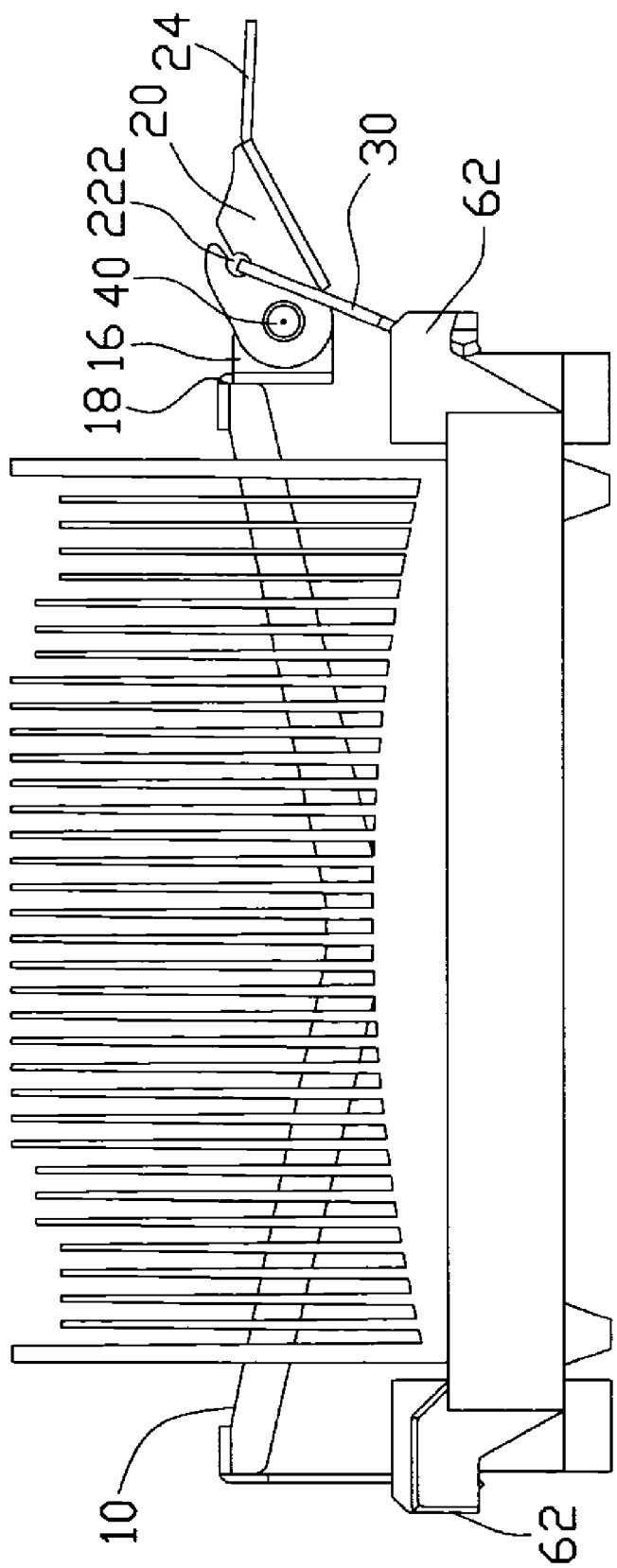
FIG. 3A is a side elevation view of FIG. 1 partially assembled.

Referring to FIG. 1 and FIG. 2, in assembly of the heat sink 50 onto the retention module 60, the heat sink 50 is placed on the retention module 60. The body 10 of the heat sink clip 100 is received in the locating grooves 52 of the heat sink 50 with a middle portion of fins (not labeled) of the heat sink 50 extending through the elongated slot 12. The mounting hole 142 of the locking arm 14 and the mounting hole 34 of the movable fastener 30 are then sleeved onto their respective locking blocks 62 of the retention module 60. The actuating member 20 is then turned from the unlocked position (see FIG. 3A) to the locked position (see FIG. 3B), and the movable fastener 30 is consequently moved upwardly to fasten with the retention module 60, and the actuating member 20 compels the body 10 downwardly to thereby secure the heat sink 50 to the retention module 60. No matter whether the actuating member 20 is in the locked or unlocked position, the actuating member 20 is always located on an outside of the heat sink 50. A heat generating electronic component (not shown) which usually is a central processing unit (CPU) and mounted within the retention module 60 thus can have an intimate contact with the heat sink 50. Accordingly, heat generated by the CPU can be absorbed and dissipated by the heat sink 50.

Figure 3B:
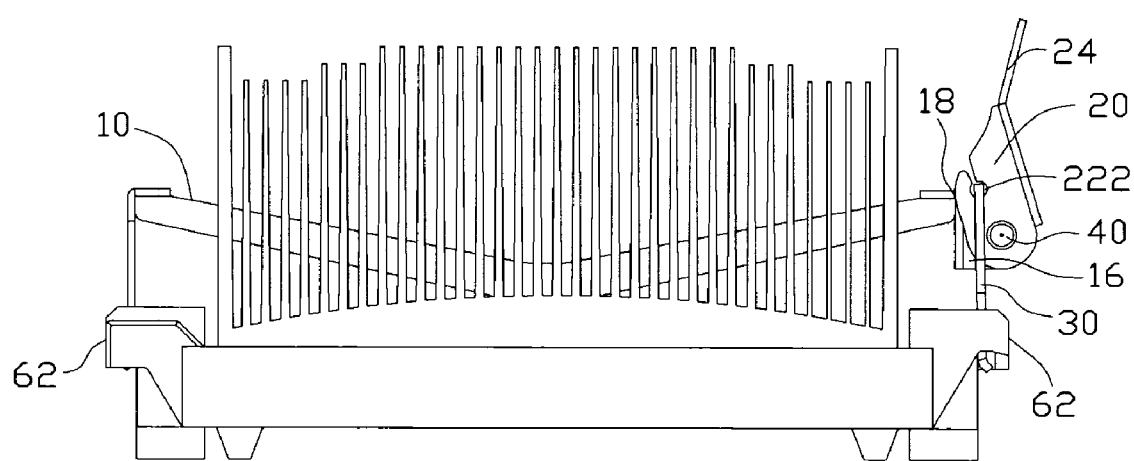
FIG. 3B is a side elevation as in FIG. 3A showing the assembly completed.
Figure 4:
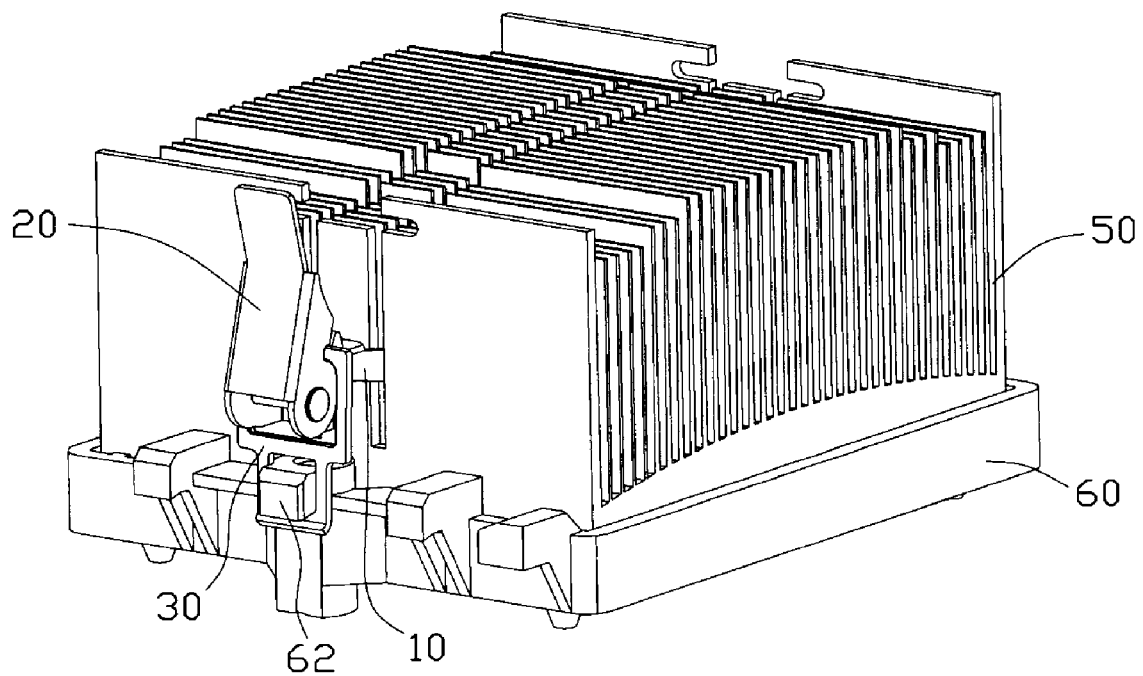
FIG. 4 is an assembled view of FIG. 1.

Referring to FIG. 3B and FIG. 4, in the locked position, the upper portion of the actuating member 20 rests on the bearing portion 18 of the body 10, and the heat sink clip 100 is therefore in a self-locking state.

When unlocking the heat sink clip 100, the actuating member 20 is turned from the locked position to the unlocked position; the user can then easily remove the heat sink clip 100 and the heat sink 50 from the retention module 60. From FIGS. 3A and 3B, it can be clearly seen that in the unlocked position, the connecting point between the securing portion 16 of the body 10 and the actuating member 20, i.e., the pivot 40, is located at one side of the movable fastener 30 and between the movable fastener 30 and the heat sink 50. In the locked position, the connecting point, i.e., the pivot 40 is located at an opposite side of the movable fastener 30 so that the movable fastener 30 is located between the pivot 40 and the heat sink 50.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink clip comprising:
   a body having a securing portion formed at one end thereof;
   an actuating member being pivotably mounted to the securing portion of said body and having a main body, the main body defining an open aperture therein; and
   a movable fastener being pivotably connected to the open aperture of the actuating member;
   said actuating member being turnable relative to said body between an unlocked position and a locked position for locking a heat sink to a retention module and unlocking the heat sink from the retention module; wherein an upper portion of said movable fastener defines an opening therein, one portion of the movable fastener above the opening being received in the open aperture of said actuating member, whereby the movable fastener is pivotably connected to the actuating member, and a lower portion of said actuating member extends through the opening.

2. The heat sink clip as described in claim 1, wherein said body has a locking arm integrally formed at the other end thereof, and the locking arm defines a mounting hole therein for engaging with the retention module.

3. The heat sink clip as described in claim 2, wherein said body defines an elongated slot between one end and the other end.

4. The heat sink clip as described in claim 1, wherein a bearing portion is formed at the one end of said body, and said actuating member rests on the bearing portion of said body in the locked position.

5. The heat sink clip as described in claim 1, wherein the securing portion of said body defines a pair of coaxial pivot holes therein, the main body of said actuating member defines a pair of coaxial pivot holes below the open aperture, and the main body of the actuating member is pivotably mounted to the securing portion via a pivot extending through the pivot holes of the actuating member and the securing portion.

6. The heat sink clip as described in claim 5, wherein the actuating member comprises an operating handle extending from an upper portion of the main body.

7. The heat sink clip as described in claim 5, wherein a lower portion of the movable fastener defines a mounting hole therein.

8. A heat sink assembly comprising:
   a retention module;
   a heat sink placed on the retention module; and
   a heat sink clip, said heat sink clip comprising:
   a body placed on the heat sink, said body having a securing portion formed at one end thereof, the other end of said body being attached to the retention module;
   an actuating member being pivotably mounted to the securing portion of said body at a connecting point; and
   a movable fastener having an upper portion and a lower portion, the upper portion of said movable fastener defining an opening therethrough, the upper portion being attached to said actuating member, the lower portion being sleeved onto the retention module;
   said actuating member being turnable relative to said body between an unlocked position and a locked position, wherein, in the unlocked position, the connecting point formed between the securing portion of said body and the actuating member is located at one side of the movable fastener, and wherein when the actuating member is turned from the unlocked position to the locked position, the connecting point traverses through the opening of the movable fastener to be located at an opposite side of the movable fastener.

9. The heat sink assembly as described in claim 8, wherein said actuating member defines an open aperture therein, the opening of said movable fastener is sleeved onto said actuating member at the open aperture.

10. The heat sink assembly as described in claim 8, wherein said body forms a bearing portion close to the securing portion thereof, and in the locked position, said actuating member rests on the bearing portion.

11. The heat sink assembly as described in claim 8, wherein the heat sink defines two parallel grooves therein, said body defines an elongated slot between the one end and the other end thereof, said body being received in the grooves of the heat sink with fins of the heat sink extending through the elongated slot.

12. The heat sink assembly as described in claim 8, wherein said actuating member is located on an outside of the heat sink.

13. A heat sink clip comprising:
   a body having a first end forming a locking arm with a mounting hole adapted for engaging with a locking block of a retention module and a second end opposite the first end;
   an actuating member pivotably mounted on the second end of said body and defining an open aperture at an upper portion; and
   a movable fastener having an upper end defining an opening for sleeving onto the upper portion of the actuating member at the open aperture thereof and a lower end defining a mounting hole adapted for engaging with a locking block of the retention module;
   wherein said actuating member is movable between a locked position and an unlocked position, and said actuating member rests on the second end of said body in the locked position.

14. The heat sink clip as described in claim 13, wherein the second end of said body forms a bearing portion, the upper portion of said actuating member rests on the bearing portion of said body in the locked position.

15. The heat sink clip as described in claim 13, wherein one portion of the movable fastener above the opening being received in the open aperture of said actuating member, whereby the movable fastener is pivotably connected to the actuating member, and a lower portion of said actuating member extends through the opening.

* * * * *